(12) United States Patent
Arena et al.

(10) Patent No.: US 7,902,045 B2
(45) Date of Patent: Mar. 8, 2011

(54) PROCESS FOR FABRICATING A STRUCTURE FOR EPITAXY WITHOUT AN EXCLUSION ZONE

(75) Inventors: Chantal Arena, Mesa, AZ (US); Fabrice Letertre, Meylan (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 183 days.

(21) Appl. No.: 12/134,019

(22) Filed: Jun. 5, 2008

(65) Prior Publication Data

US 2008/0303118 A1 Dec. 11, 2008

(30) Foreign Application Priority Data

Jun. 6, 2007 (FR) ...................... 07 55512

(51) Int. Cl.
*H01L 21/30* (2006.01)
(52) U.S. Cl. ................ 438/459; 438/458; 257/E21.122; 257/E21.567
(58) Field of Classification Search .................. 438/458, 438/459; 257/E21.122, E21.567
See application file for complete search history.

(56) References Cited

U.S. PATENT DOCUMENTS

| | | | | |
|---|---|---|---|---|
| 6,328,796 B1 | 12/2001 | Kub et al. | | 117/94 |
| 6,497,763 B2 | 12/2002 | Kub et al. | | 117/94 |
| 6,573,126 B2 * | 6/2003 | Cheng et al. | | 438/149 |
| 6,794,276 B2 | 9/2004 | Letertre et al. | | 438/506 |
| 6,974,760 B2 | 12/2005 | Ghyselen et al. | | 438/459 |
| 2004/0121557 A1 * | 6/2004 | Ghyselen | | 438/455 |
| 2004/0235268 A1 * | 11/2004 | Letertre et al. | | 438/459 |
| 2006/0035440 A1 * | 2/2006 | Ghyselen et al. | | 438/458 |
| 2007/0023867 A1 | 2/2007 | Aulnette et al. | | 257/618 |
| 2007/0087526 A1 * | 4/2007 | Chhaimi et al. | | 438/455 |

FOREIGN PATENT DOCUMENTS

| | | |
|---|---|---|
| EP | 1 156 531 A1 | 11/2001 |
| FR | 2888400 | 1/2007 |
| FR | 2860842 | 4/2007 |

OTHER PUBLICATIONS

Preliminary Search Report corresponding to FR0755512.
Anke Sanz-Velasco et al., "Room Temperature Wafer Bonding Using Oxygen Plasma Treatment in Reactive Ion Etchers With and Without Inductively Coupled Plasma", Journal of the Electrochemical Society vol. 150 , No. 2, pp. G 155-G162 (2003).

* cited by examiner

*Primary Examiner* — Steven J Fulk
(74) *Attorney, Agent, or Firm* — Winston & Strawn LLP

(57) ABSTRACT

A process for fabricating a composite structure for epitaxy, including at least one crystalline growth seed layer of semiconductor material on a support substrate, with the support substrate and the crystalline growth seed layer each having, on the periphery of their bonding face, a chamfer or an edge rounding zone. The process includes at least one step of wafer bonding the crystalline growth seed layer directly onto the support substrate and at least one step of thinning the crystalline growth seed layer. After thinning, the crystalline growth seed layer has a diameter identical to its initial diameter.

16 Claims, 4 Drawing Sheets

US 7,902,045 B2

PROCESS FOR FABRICATING A STRUCTURE FOR EPITAXY WITHOUT AN EXCLUSION ZONE

BACKGROUND OF THE INVENTION

The present invention relates to the field of semiconductor materials such as those of the Group III/N, Group III/V type or materials of Group IV of the Periodic Table of the Elements, produced in layers by epitaxial (homoepitaxial or heteroepitaxial) growth from composite structures typically comprising a support substrate and a crystalline growth seed layer from which the epitaxial growth of the layer of semiconductor material is carried out. The expression "materials of Group III/V type" should be understood to mean materials of the elements from column III and from column V of the Periodic Table of the Elements, while Group IV means column IV of the Periodic Table. As a skilled artisan is aware, these materials may be binary, ternary or quaternary materials.

PRIOR ART

This type of composite structure is generally produced using the well-known SMART-CUT® technology. An illustrative example of a composite structure for epitaxial growth using the SMART-CUT® technology is given in FIGS. 1A to 1C.

FIG. 1A shows a source substrate or donor substrate 1, one face of which is subjected to implantation by bombardment of ionic species 10 (for example H$^+$ions) so as to create a weakened zone 2 at a certain depth in the substrate. As illustrated in FIG. 1B, that face of the donor substrate 1 which has undergone the implantation is brought into intimate contact with a support substrate or "receiver" substrate 3 (by wafer bonding). Next, as shown in FIG. 1C, the donor substrate is cleaved in the weakened zone in order to transfer the part located between the face that had undergone implantation and the weakened zone of the donor substrate onto the receiver substrate, the transferred part constituting a crystalline growth seed layer 4.

As illustrated in FIG. 1C, during fabrication of composite substrates by transferring a thin crystalline growth seed layer onto a support substrate by the SMART-CUT® technology, an "exclusion zone" or ring 5, which corresponds to an untransferred part of the thin layer 4, is formed on the periphery of the support substrate 1.

This is because, as illustrated very schematically in FIG. 1B and according to the SEMI™ standards, the donor substrate 1 and the support substrate 3 have, on the periphery of their respective surfaces, a chamfer or an "edge rounding" zone 1a and 3a, the role of which is to make it easier to handle the substrates and to avoid edge fragments which could be produced if these edges were projecting edges, such fragments being sources of particulate contamination of wafer surfaces.

However, the presence of such a chamfer prevents good contact between the support substrate and the donor substrate around their periphery. As a consequence, the bonding force obtained on the periphery of the assembly is insufficient to retain over its full width that part of the donor substrate to be transferred onto the support substrate. The crystalline growth seed layer 4 to be transferred has a small thickness, which is limited to several hundred nanometers because of the way it is formed by implantation. This small thickness mechanically weakens the seed layer, which breaks at the chamfer during detachment. The layer 4 detached from the donor substrate 1 is therefore not transferred at the periphery of the support, thereby creating the exclusion zone 5.

A thick layer formed by epitaxy on a crystalline growth seed layer that includes an exclusion zone will conform to the truncated diameter of the transferred thin seed layer, which is smaller than that of a standardized support substrate. This results in a consequent loss of material.

In addition, when the thick layer is then used as donor substrate for transferring a thin layer according to the SMART-CUT® technology, an exclusion zone again forms owing to edge rounding. The substrate obtained has in the end a very substantial ring of missing material, thereby limiting its use.

U.S. Pat. No. 6,974,760 describes this phenomenon and discloses a thin layer transfer method in which the implantation doses and energy are parameterized so that the material on the donor substrate corresponding to this exclusion zone is reduced and exfoliated at the moment of detachment. The donor substrate is therefore more easily recycled.

However, with or without a specific transfer method, there always remains an exclusion zone on the periphery of the transferred layer. To obtain a transferred layer having a diameter equivalent to that of a standardized substrate, it is necessary to use support substrates and donor substrates having larger diameters than the desired diameter of the layer to be transferred. Besides the additional material cost, however, the treatment equipment used for fabricating this type of composite structure is suitable only for receiving wafers having specific (standard) diameters, such as for example wafers 200 mm in diameter. This equipment cannot in general be adjusted for receiving wafers of other diameters.

Moreover, the heating needed to strengthen the bond between the support substrate and the weakened donor substrate must not cause fracture before the assembly has been sufficiently bonded. In this case, there is a risk of the fracture being partial or less precise. To obtain sufficient adhesion despite this necessity for bonding at low temperature, the surfaces to be bonded must be perfectly planar and any roughness thereon must be highly polished in order to obtain good contact and maximum adhesion. This further increases the fabrication cost, especially in the case of hard materials such as SiC or GaN.

SUMMARY OF THE INVENTION

The invention now remedies the aforementioned drawbacks and proposes a structure that allows epitaxial growth of thick layers of semiconductor materials, especially of Group III/N, Group III/V and Group IV type. Also, these layers having a specified diameter corresponding to the initial diameter of the growth layer, and do so even when wafers having a peripheral chamfer or edge rounding zone are used.

This invention specifically relates to a process for fabricating a composite structure for epitaxy, which comprises at least one crystalline growth seed layer of semiconductor material on a support substrate, with the support substrate and the crystalline growth seed layer both having, on the periphery of their bonding face, a chamfer or an edge rounding zone. The process includes at least one step of bonding by molecular adhesion the crystalline growth seed layer onto the support substrate and at least one step of thinning the crystalline growth seed layer, with the crystalline growth seed layer having, after thinning, a diameter identical to its initial diameter.

Thus, the process of the invention makes it possible to obtain a growth substrate for forming epitaxially grown layers without loss of diameter compared to a growth substrate produced using the SMART-CUT® technology. This is because, unlike the fabrication of such a composite structure using the SMART-CUT® technology, the composite structure according to the process of the invention is produced without transferring a growth seed layer, thereby preventing the appearance of an exclusion zone on the periphery of the layer and thus directly providing a growth seed layer with a specified diameter corresponding to the initial diameter of the wafer used to form the seed layer. The thick layers of semiconductor material obtained from this seed layer will consequently also have the same specified diameter.

Furthermore, since the process of the invention does not involve an exclusion zone on the periphery of the seed layer, the composite structure may be formed directly with a seed layer and a support substrate having a standard diameter employing the usual treatment equipment.

According to one aspect of the invention, the thickness of the crystalline growth seed layer removed is chosen so that the final thickness of the thinned crystalline growth seed layer is greater than that over which the chamfer or the edge rounding zone extends.

The seed layer, even once thinned, remains thicker than that obtained by transfer using the conventional SMART-CUT® technology. The layer therefore has a greater mechanical strength than that obtained by SMART-CUT® transfer, making it less friable during the various handling operations and consequently reducing the risk of contaminating the rest of the structure or the subsequent growth. The crystalline growth seed layer is thinned down to a final thickness of between 5 and 100 µm, preferably about 50 µm.

The support substrate may in particular be a material chosen from at least one of the following materials: polycrystalline AlN, single-crystal or polycrystalline GaN, single-crystal or polycrystalline SiC, sapphire, a ceramic, such as an aluminum oxide or alumina, or else a metal alloy such as an Mo, Cr and Ni alloy of the Hastelloy type, the proportions of the various metals of which are chosen so that the alloy has a thermal expansion coefficient close to that of the material to be epitaxially grown.

The crystalline growth seed layer of semiconductor material may in particular be a material chosen from at least one of the following materials: single-crystal Si, such as (111) Si, single-crystal SiC, single-crystal sapphire, and binary, ternary or quaternary Group III/N or Group III/V materials. These materials may be used for the epitaxial growth of Group III/N materials, such as gallium nitride (GaN). Some of these, for example Si, may also be used for epitaxial growth of Group IV materials, such as germanium, or Group III/V materials, such as GaAs.

According to one aspect of the invention, the process may include, before the bonding step, a step of forming a bonding layer, for example an oxide layer, on the bonding face of the support substrate and/or on the bonding face of the crystalline growth seed layer of semiconductor material.

According to another aspect of the invention, the process of the invention includes a step of activating the bonding surfaces, either of the support substrate and of the growth layer directly, or of the bonding layers, by plasma treatment.

The bonding step includes placing the surfaces into intimate contact at room temperature. One or more stabilization annealing steps for strengthening the bond may be carried out at a temperature between about 100° C. and 1000° C. A stabilization annealing step is in particular carried out at a temperature of between about 200° C. and 500° C. for a time of at least one hour. In as much as the thermal budget (temperature/time pair) for carrying out the bonding is not limited, as is the case with the SMART-CUT® technology for preventing fracture, it is less important to have wafers that are perfectly planar and with particularly low roughness. The roughness of the faces of the wafers to be bonded may in fact be of the order of 1 micron RMS when a bonding layer is used. This entails less expensive finishing. The cost of fabricating the composite structure is therefore reduced, this being especially advantageous as this composite structure has only ephemeral or temporary usefulness. This is because the composite structure is not found in the subsequent devices and the seed layer is destroyed after the epitaxially grown semiconductor material has been formed.

According to one particular aspect of the invention, the thinning of the crystalline growth seed layer may be carried out in several steps, with an annealing step for stabilizing the bonding carried out between two consecutive thinning steps, each stabilization annealing step being carried out at an increasing temperature, that is to say at a temperature above that of the preceding annealing step. The thinning and annealing steps are repeated until the desired thickness of seed layer and the desired bonding force are obtained.

The invention also relates to a process for producing a layer of semiconductor material, especially of the Group III/V, Group III/N and Group IV types, comprising the epitaxial growth of a layer of semiconductor material on a composite structure that includes a crystalline growth seed layer, the composite structure being produced in accordance with the fabrication process described above.

According to one aspect of the invention, the epitaxial growth is carried out for a specified time, corresponding to the formation of a layer of semiconductor material having a thickness sufficient to be self-supporting, namely a thickness of at least 100 µm. As a variant, the crystalline growth seed layer may be retained with the layer of epitaxially grown semiconductor material in order to form a self-supporting structure that can be used for epitaxial regrowth.

In this case, the epitaxial growth of the layer of semiconductor material is carried out for a specified time making it possible to obtain a combined thickness of seed layer and of semiconductor layer of at least 100 µm.

The process for producing a layer of semiconductor material may also include, before the epitaxial growth of a layer of semiconductor material, the formation of a nucleation layer on the crystalline growth seed layer. This nucleation layer acts as a buffer layer which improves the crystalline quality of the epitaxially grown semiconductor material.

The process for producing a layer of semiconductor material may furthermore comprise one or more of the following steps:

after the epitaxial growth of the layer of semiconductor material, the support substrate and the crystalline growth seed layer, optionally with the nucleation layer (in the case of the self-supporting semiconductor layer), are removed;

after the epitaxial growth of the layer of semiconductor material, the support substrate (in the case of the self-supporting seed layer/semiconductor layer structure) is removed;

the self-supporting layer of semiconductor material undergoes double-sided lapping so as to obtain a bow of less than 50 microns, the face exposed by the removal undergoes a polishing step so as to reduce its roughness and the potentially work-hardened zone, and a step of removing a peripheral portion of the layer of semiconductor material is carried out so as to obtain an average dislocation density in the layer of semiconductor material of less than $10^6/cm^2$.

The invention also relates to a multilayer structure which includes a composite structure produced in accordance with the process for fabricating a composite structure for epitaxy described above, the composite structure including a crystalline growth seed layer of semiconductor material having a thickness of at least 5 μm. The multilayer crystalline growth seed layer is thinned to have a diameter that is the same as its initial diameter.

The multilayer structure may furthermore include a layer of semiconductor material formed by epitaxial growth on the crystalline growth seed layer according to the method of producing a layer of semiconductor material described above.

According to one aspect of the invention, the layer of semiconductor material has a thickness of at least 100 μm, which is sufficient to be self-supporting. It may also have a thickness allowing the formation of a seed layer/semiconductor layer structure of at least 100 μm thickness, which again is a self-supporting structure.

DETAILED DESCRIPTION OF THE PREFERRED EMBODIMENTS

Figure 1A:
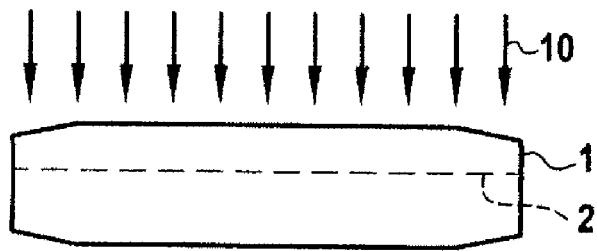
FIGS. 1A to 1C, already described, are schematic sectional views showing the production of a composite structure for epitaxy according to the prior art.

The present invention applies in general to the production of layers of semiconductor materials, in particular III/V, III/N and IV materials, by epitaxy in the form of wafers, these layers having, directly after their formation by epitaxy, a specified wafer diameter. For this purpose, the present invention proposes a process for producing a composite structure for epitaxy starting from wafers having a chamfer or "edge rounding" zone, which process nevertheless makes it possible to produce epitaxially grown layers of semiconductor material without loss of diameter compared to the initial diameter of the wafer used to form the crystalline growth seed layer. As described below, the composite structure for epitaxy according to the invention comprises at least a support substrate and a crystalline growth seed layer of semiconductor material.

The material of the support substrate may be chosen so as to have a thermal expansion coefficient (TEC) close to that of the semiconductor material that has to be formed by epitaxy from the composite structure, so as to avoid the appearance of cracks in the latter during cooling and when the thickness of the epitaxially grown layer exceeds a threshold thickness.

The material of the support substrate may be polycrystalline AlN (less expensive than single-crystal AlN), single-crystal or polycrystalline SiC, a metal alloy, such as Hastelloy (an alloy of Cr, Mo and Ni), sapphire, ceramic, such as aluminum oxide, also known as alumina $Al_2O_3$, or any other inexpensive material whose thermal expansion coefficient is matched to that of the semiconductor material to be epitaxially grown. In the case of gallium nitride (GaN) epitaxy, the support is preferably chosen from polycrystalline or single-crystal GaN and polycrystalline aluminum nitride (AlN). Since polycrystalline AlN is a ceramic, its thermal expansion coefficient may be adjusted during its production so as to correspond to that of GaN.

The material of the crystalline growth seed layer is a single-crystal material. It is chosen so as to allow a semiconductor material to be grown with a defect density of less than $10^9/cm^2$ and preferably less than $10^6/cm^2$ on the rear face, for example $10^4/cm^2$ in the case of germanium material. The rear face of the epitaxially grown layer of semiconductor material corresponds to the face that was in contact with the seed layer, but which could be thinned during the final preparation of the layer for subsequent use. This face has the highest defect density of the layer of semiconductor material since, during growth, the defect concentration of the epilayer formed tends to decrease. In the case of GaN, the growth of which is carried out along the c axis of the Wurtzite crystallographic structure, this is typically the N-polarity face.

In the case of forming the layer of semiconductor material by homoepitaxy, it is sufficient for the seed layer to have, on the surface, a defect density of less than $10^9/cm^2$ and preferably less than $10^6/cm^2$. In the case of forming the layer of semiconductor material by heteroepitaxy, the material of the seed layer is chosen to have a lattice parameter and a crystalline quality allowing growth of a layer of semiconductor material with a defect density of less than $10^9/cm^2$ and preferably less than $10^6/cm^2$ on the rear face.

The material of the crystalline seed layer may also be chosen to have a thermal expansion coefficient that is close to that of the support substrate, knowing that the influence of the thermal expansion coefficient of the seed layer is greater when its thickness is no longer negligible compared with that of the support substrate. Thus, the structure will remain stable during the temperature variations to which it will be subjected. Moreover, the annealing step for stabilizing the bonding of the seed layer to the support substrate may be carried out at a higher temperature the smaller the difference between the thermal expansion coefficients of the materials.

The crystalline growth seed layer may in particular consist of sapphire ($Al_2O_3$), single-crystal silicon, for example (111) Si, single-crystal SiC, adapted for example for GaN epitaxy, or binary, ternary or quaternary single-crystal Group III/V or Group III/N materials. The roughness of the face prepared for epitaxy is a few Angstroms RMS.

As is well known, various binary, ternary or quaternary materials based on Group III/V or Group III/N semiconductor materials may be formed, depending on the nature of the crystalline growth seed layer. The composite structure for epitaxy of the invention is especially intended for the epitaxial growth of GaN, InGaN, AlGaN, AlGaInN and indium nitride InN.

Figure 1B:
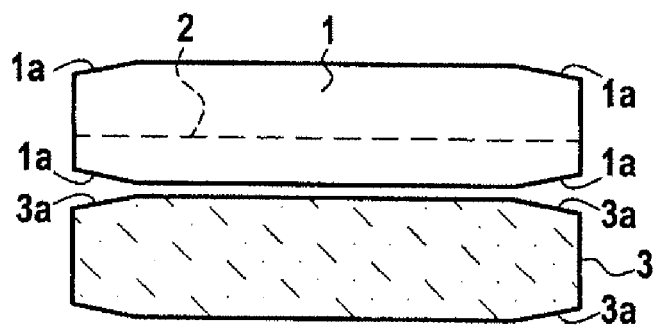
Figure 1C:
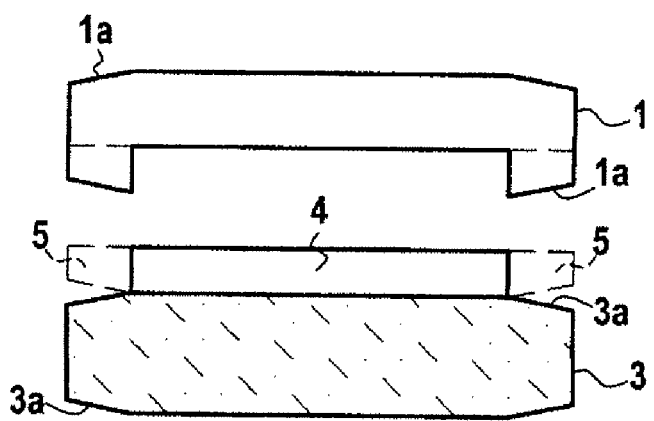

A process for fabricating a composite structure followed by a process for producing a layer of semiconductor material, here a Group III/N material, by epitaxy according to one embodiment of the invention will now be described with reference to FIGS. 2A to 2G and 3. Although this has not been shown in FIGS. 2A to 2G, the support substrate and the crystalline growth seed layer each has, on their two surfaces, a chamfer or "edge rounding" in accordance with the SEMI™ standards, as illustrated exaggeratedly on purpose in FIGS. 1A to 1C.

The production of the composite structure for epitaxy starts with a support substrate being bonded to a crystalline growth seed layer. This bonding is carried out by molecular adhesion, either directly between these two elements, or via bonding layers.

The principle of wafer bonding is well-known per se and will not be described in greater detail. As a reminder, the bonding by molecular adhesion is based on the intimate contacting of two surfaces, that is to say without the use of a specific material (adhesive, wax, low-melting-point metal, etc.), the attractive forces between the two surfaces being high enough to cause molecular adherence (bonding induced by all the attractive forces (Van Der Waals forces) for electronic interaction between atoms or molecules of the two surfaces to be bonded together).

Figure 2A:
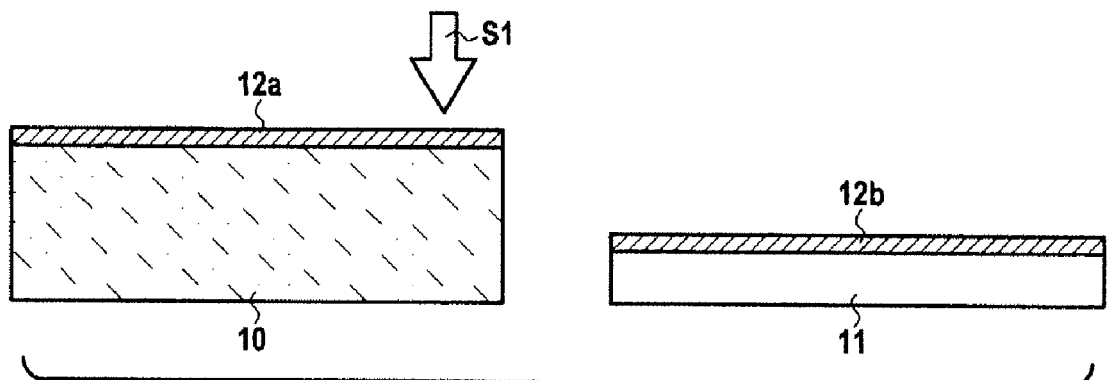
FIGS. 2A to 2G are schematic sectional views showing the production of a composite structure for epitaxy in accordance with one embodiment of the invention.

In the embodiment presented here, a bonding layer is deposited both on one face of a support substrate 10 and on one face of a crystalline growth seed layer 11 of Group III/N material (step S1, FIG. 2A). In the example described here, the support substrate 10 is made of polycrystalline aluminum nitride (AlN) and the crystalline growth seed layer 11 is made of sapphire ($Al_2O_3$). The support substrate and the growth seed layer each have a surface roughness of 1 μm.

The bonding layers 12a and 12b used in the present example are oxide bonding layers deposited on the support substrate 10 and the crystalline growth seed layer 11, respectively. More precisely, the layers 12a and 12b here are silicon oxide ($SiO_2$) layers formed by LPCVD (low-pressure chemical vapor deposition) or by PECVD (plasma-enhanced chemical vapor deposition). However, the bonding layers may also be diamond layers, glass layers of the SOG (spin-on glass) type, AlN layers, silicon nitride (such as $Si_3N_4$) layers or BPSG (borophosphosilicate glass) oxide layers (BPSG oxide is well known to those skilled in the art to be a silicate glass doped with boron and phosphorus). If two bonding layers are used, it may be advantageous to choose different bonding materials in order to obtain better adhesion. For example, an $Si_3N_4$ layer may be deposited on a GaN seed layer that will be bonded to a sapphire support substrate covered with a silicon oxide layer. The bonding layer or layers have a thickness ranging from a few tens of nanometers to about 10 μm.

When the bonding layers 12a and 12b are oxides, an annealing step to densify the oxide, before bonding, at a higher temperature than that of the deposition, may if necessary be carried out in order to increase the bonding force between the crystalline seed layer and the support substrate.

The surface of the oxide bonding layers 12a and 12b is planarized by CMP (chemical-mechanical polishing) in order to obtain an surface roughness of less than 5 Å RMS and thus make the subsequent intimate contacting (step S2) easier.

Figure 2B:
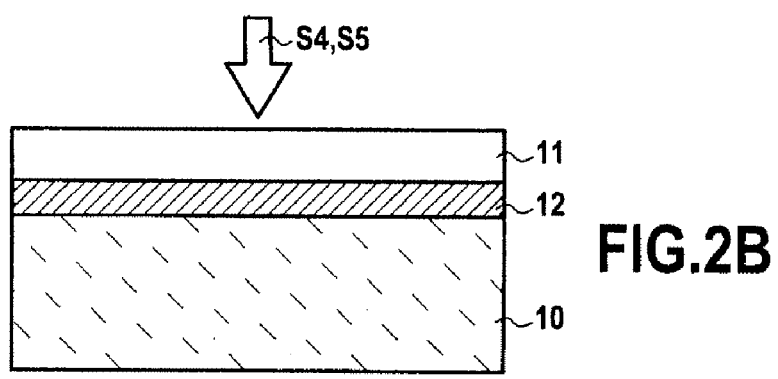

Next, plasma-type bonding of the support substrate 10 to the crystalline growth seed layer 11 may be carried out by bringing the oxide bonding layers 12a and 12b into intimate contact and by carrying out a stabilization annealing step at 500° C. for a time of about 2 hours (FIG. 2B, steps S4 and S5). The bonding is of the plasma type, which means that the surfaces of the oxide bonding layers 12a and 12b are plasma-treated (step S3) before they are brought into intimate contact with each other. The plasma treatment makes it possible in particular to activate the bonding surface of the layers 12a and 12b so as to increase their bondability. Thus, the surface of the layers 12a and 12b may be exposed to a plasma based on oxygen, nitrogen, argon or other gases.

The equipment used for this purpose may in particular be equipment initially designed for CC-RIE (capacitively coupled reactive ion etching) or ICP-RIE (inductively coupled plasma reactive ion etching). For more details, the reader may for example refer to the document by Sanz-Velasco et al entitled "*Room temperature wafer bonding using oxygen plasma treatment in reactive ion etchers with and without inductively coupled plasma*" (Journal of Electrochemical Society 150, G155, 2003).

Other atmospheric-plasma equipment or equipment provided with an ECR (electron cyclotron resonance)-type or helicon-type source may also be used.

In practice, plasma bonding activation in general comprises beforehand a chemical cleaning operation, such as an RCA cleaning operation, followed by chemical-mechanical polishing in order to smooth any roughness, and then exposure of the surface to a plasma for between a few seconds and a few minutes.

The treatment steps (S2 to S5) described above may of course also be carried out with bonding layers other than oxide layers, and in particular with bonding layers consisting of diamond, AlN or silicon nitride.

In the case of bonding between the support substrate and the crystalline growth seed layer without a bonding layer, the bonding surfaces of these two elements may also be plasma-activated beforehand, as described above. The bonding between these two elements may be hydrophilic bonding or hydrophobic bonding depending on the nature of the materials used.

As shown in FIG. 2B, what is obtained after the bonding is a composite structure comprising the support substrate 10, an oxide layer 12, corresponding to the oxide bonding layers 12a and 12b, and the crystalline growth seed layer 11.

Figure 2C:
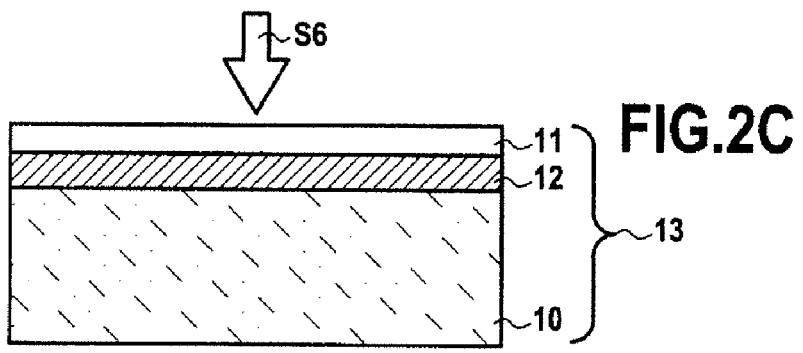

The crystalline growth seed layer 11 is thinned down to a thickness of 50 μm (step S6, FIG. 2C). This thinning operation may be carried out by lapping and/or mechanical polishing and/or chemical etching of the exposed face of the crystalline growth seed layer 11. The surface of the crystalline seed layer 11 may then be prepared for epitaxy by CMP. The final thickness of the layer 11 is chosen to be greater than the thickness over which the chamfer or edge rounding extends, thereby avoiding any reduction in diameter of the layer 11 and any risk of this mechanically fragile layer flaking off. In general, the final thickness of the crystalline growth seed layer is between about 5 and 100 μm, and preferably 50 μm.

Thus, by avoiding any reduction in diameter of the seed layer during fabrication of the structure for epitaxy, it is possible to determine at the start the diameter of the epitaxially grown layer formed subsequently, since this will have the same diameter as the crystalline growth seed layer. For example in the case in which it is desired to obtain epilayers having a standard diameter (100 mm, 200 mm or 300 mm for example), it is sufficient to produce a structure for epitaxy according to the invention with a seed layer formed from a wafer having the intended standard diameter.

As indicated in FIG. 2C, what is then obtained is a composite structure for epitaxy 13 comprising the support substrate 10, an oxide ($SiO_2$) bonding layer 12 and the thinned crystalline growth seed layer 11. The composite structure 13 may, furthermore, be subjected to a second annealing step for stabilizing the bonding, carried out at a temperature of 900° C. for about 1 hour (step S7).

It is also possible for the thinning of the seed layer to be carried out in several steps, between which bonding stabilization annealing steps may be carried out in order to improve the bonding force of the composite structure. For example, after the first bonding stabilization annealing step at 200° C., the seed layer is thinned down to a specified thickness, for example 500 microns, followed by another stabilization annealing step carried out at 300° C. for one hour. A second thinning step is then carried out down to a thickness of 400 microns, followed by another stabilization annealing step carried out at a temperature above that of the previous annealing step, for example at 400° C. These steps may be repeated until the desired bonding force and the desired thickness of the seed layer are achieved.

The rest of the description relates to the steps implemented for producing an epilayer of Group III/N single-crystal material starting from the crystalline growth seed layer 11 of the composite structure 13.

The epilayer of Group III/N material formed must have a sufficient thickness to be self-supporting, that is to say sufficient to form a layer that can support itself without the addition of a mechanical support or stiffener. For this purpose, the epitaxial growth is carried out until the layer of Group III/N material has a thickness of between 100 μm and 1 mm, preferably between 500 μm and 1 mm.

The layer of Group III/N material is at least partly grown by HVPE (hydride vapor phase epitaxy). This type of epitaxy is carried out at a temperature between 700° C. and 1100° C.

The epitaxial growth is continued until a thickness is reached that is sufficient for the layer of Group III/N material to be subsequently self-supporting, when it will be separated from the support substrate 10.

The way in which such epitaxy is carried out and the respective parameters and orientations of both the crystalline growth seed layer and the thick layer of Group III/N material are known to those skilled in the art. Since the crystallographic plane of the seed layer determines that of the epitaxially grown material, it is possible to obtain materials that are polar, nonpolar or semipolar by choosing the crystalline orientation of the seed layer, which is sometimes desired in the case of GaN.

In an alternative embodiment of the invention, it is also possible to carry out, before growth of the thick layer of Group III/N material, a step of epitaxially growing a nucleation layer (not shown in the Figures) made of the same material as that of the crystalline growth seed layer and/or as that used subsequently for producing the thick layer of Group III/N materials. However, this nucleation layer may also be of a different nature from that of the thick layer of Group III/N material and/or of the seed layer. For example, it is possible to deposit an AlN nucleation layer on a silicon carbide (SiC) seed layer before the epitaxial growth of a thick GaN layer. The nucleation layer on the seed layer acts as a buffer and makes it possible to improve the crystalline quality of the thick layer of Group III/N material formed subsequently. The nucleation layer has a thickness of between 10 nm and 10 μm.

In this case, and in particular for GaN, the epitaxy of this nucleation layer may be carried out by MOCVD (metal organic chemical vapor deposition) or by MBE (molecular beam epitaxy).

It is also possible to use ELO (epitaxial lateral overgrowth) techniques.

Figure 2D:
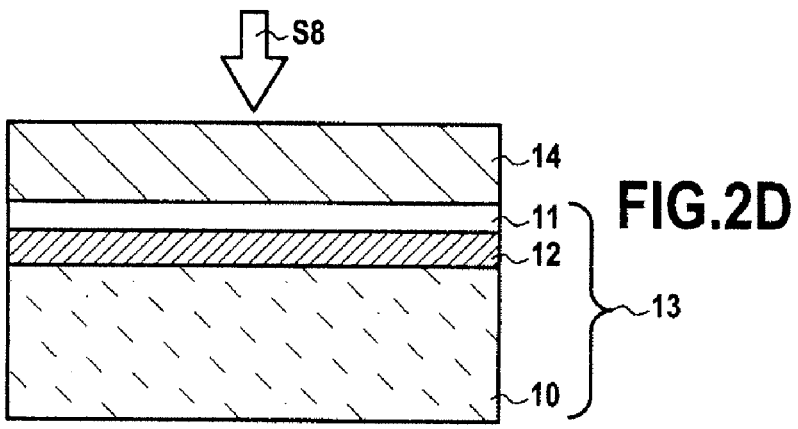

In the embodiment described here, epitaxial growth of a GaN layer is carried out on the $A_2O_3$ crystalline growth seed layer 11 by HVPE at a temperature of 800° C. for a time sufficient to form a GaN layer 14 with a thickness of about 1 mm (step S8, FIG. 2D).

Figure 2E:
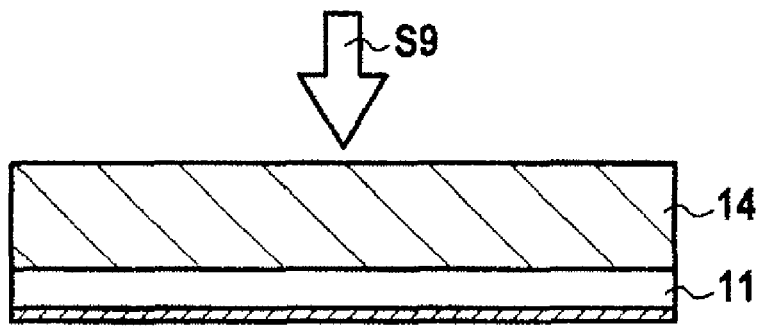

When the bonding layer 12 is an oxide layer, it is then chemically etched, for example with an HF solution, in order to detach the support substrate 11 from the rest of the structure (step S9, FIG. 2E).

Figure 2F:
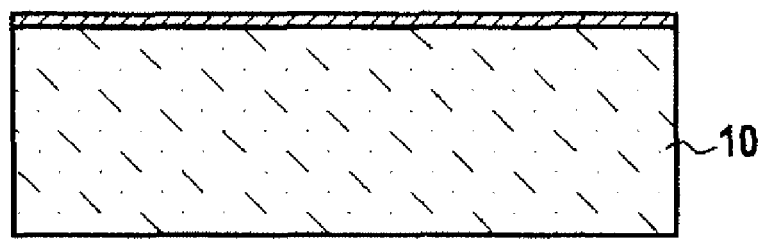

The residual oxide and the crystalline growth seed layer 11 remaining on the GaN layer 14 are chemically etched so as to be removed (step S10, FIG. 2F). The chemical etching techniques for removing such materials are well known to those skilled in the art.

The crystalline growth seed layer, and optionally the support substrate if there is no oxide bonding layer, may also be mechanically removed by polishing.

The self-supporting GaN layer is polished by double-sided lapping so as to correct the planarity and/or to remove any region liable to have a "wafer bow" that is too great for subsequent usage. The two faces of the material are polished simultaneously so as to obtain a bow of less than 50 microns (maximum surface parallelism is achieved with a bow of 15 microns). It is then necessary to carry out a polishing step on the rear face in order to reduce the roughness of the surface to a value of less than 5 ångströms, for example so as to be able to be bonded in a subsequent use (step S11, FIG. 2F). This polishing also serves to reduce the defect density on the rear face down to a desired useful dislocation density, such as for example less than $10^7/cm^2$ and preferably less than $10^6/cm^2$. Finally, this polishing serves to remove the subsurface region potentially work-hardened by the double-sided lapping step.

Figure 2G:
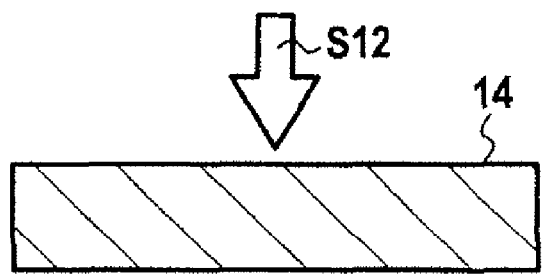
Figure 3:
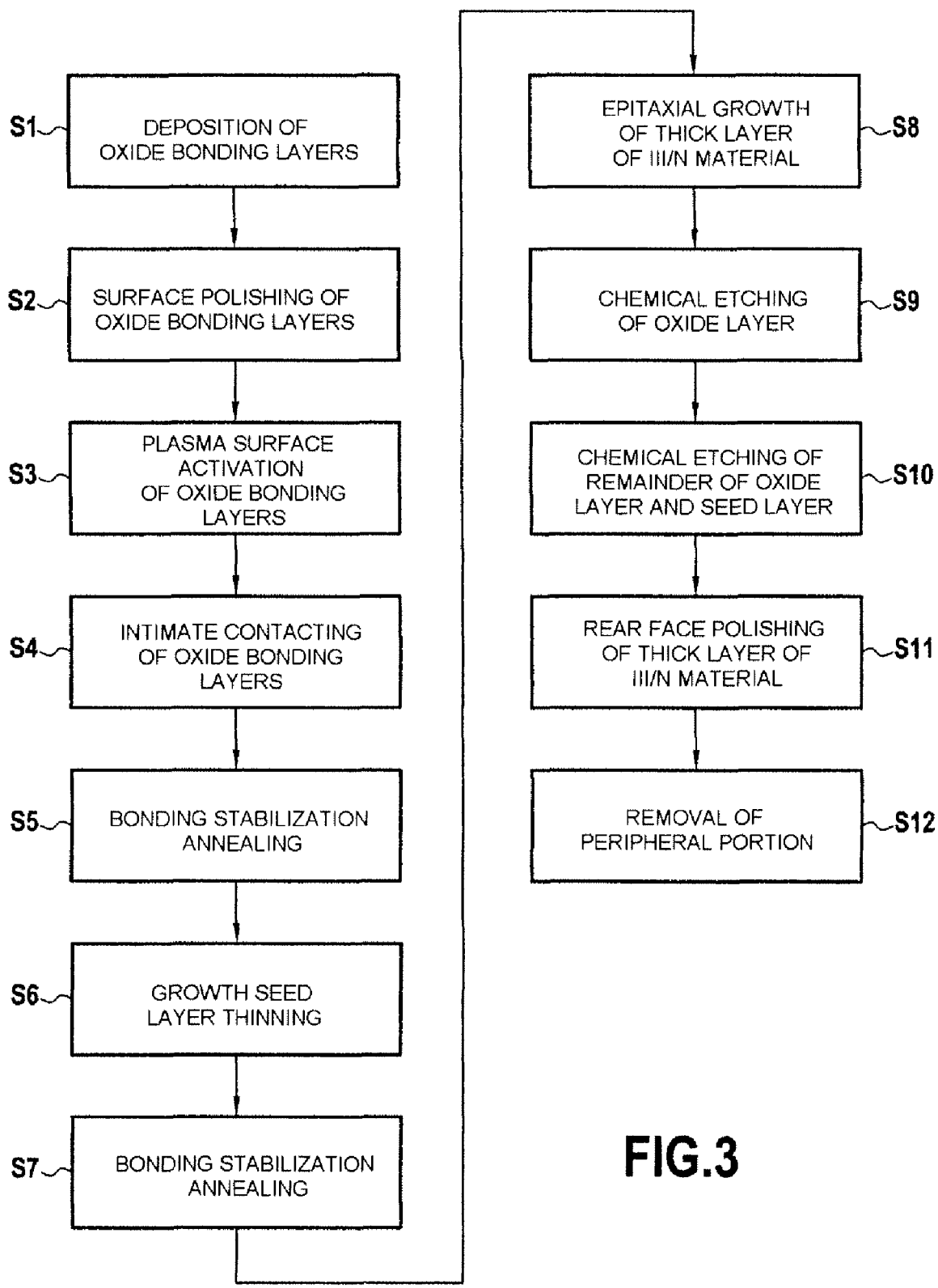
FIG. 3 is a flowchart of the steps carried out in FIGS. 2A to 2G.

A peripheral portion 14a of the self-supporting GaN layer 14 having, by nature, a very high defect density and possibly cracks, may also be removed so that in the end the layer has a maximum defect density of $10^6/cm^2$ (step S12, FIG. 2G).

An adjustment operation is also carried out, so as to form chamfers or rounded edges on both surfaces of the layer near its periphery.

According to another embodiment of the invention, epitaxial growth is carried out on the composite structure prepared for epitaxy so as to obtain a thin layer of material having a thickness such that the combination of the seed layer and the semiconductor layer formed by epitaxy can be self-supporting. The combined thickness of the semiconductor epilayer and the seed layer is between 100 μm and 1 mm, preferably between 500 μm and 1 mm. In this case, only the support substrate is removed. The structure thus obtained is used for epitaxial regrowth in the same material as that of the thin layer, until the desired thickness is reached. It is also conceivable to use a different material. The advantage of this embodiment of the invention lies in the fact that the epitaxial regrowth is free of thermal expansion coefficient mismatch strains due to the nature of the support.

Moreover, the composite structure for epitaxy according to the invention may be produced with a crystalline growth seed layer having the same diameter as the support substrate (10) but the support substrate may also have a diameter different from that of the crystalline growth seed layer, since it is the diameter of the latter that determines the diameter of the semiconductor layer to be formed by epitaxy. When the epilayer is sufficiently thick to be self-supporting, the finishing steps, including the removal of the peripheral portion, make it possible, if necessary, to modify its diameter.

The process of the invention is also not limited to the production of self-supporting layers of semiconductor materials. The composite structure for epitaxy obtained using the process of the invention may also be used for growing thin layers that are intended to be transferred onto a final substrate having specific properties. The composite structure of the invention may also be used to grow a stack of thin layers of various semiconductor materials that may be self-supporting.

What is claimed is:

1. A process for fabricating a composite structure for epitaxy, which comprises at least one crystalline growth seed layer of a semiconductor material on a support substrate, with the support substrate and crystalline growth seed layer(s) both having, on a periphery of their bonding face, a chamfer or an edge rounding zone, at least one step of bonding by molecular adhesion the crystalline growth seed layer onto the support substrate; and at least one step of thinning the crystalline growth seed layer, such that the crystalline growth seed layer has, after thinning, a diameter identical to its initial diameter.

2. The process as claimed in claim 1, wherein, during the thinning step, the thickness of the crystalline growth seed layer removed is chosen so that the final thickness of the crystalline growth seed layer is greater than that over which the chamfer or the edge rounding zone extends.

3. The process as claimed in claim 2, wherein the crystalline growth seed layer is thinned down to a final thickness of between 5 and 100 μm.

4. The process as claimed in claim 1, wherein the crystalline growth seed layer has a defect density of less than $10^9/cm^2$ on its surface.

5. The process as claimed in claim 1, wherein the support substrate is a material of: polycrystalline AN, single-crystal or polycrystalline GaN, single-crystal or polycrystalline SiC, sapphire, a ceramic, or a metal alloy.

6. The process as claimed in claim 5, wherein the crystalline growth seed layer of semiconductor material is a material of: single-crystal Si, single-crystal SiC, single-crystal sapphire, or binary, ternary or quaternary Group III/V or Group III/N material.

7. The process as claimed in claim 1, which further comprises, before the bonding step, a step of forming a bonding layer on the bonding face of the support substrate or on the bonding face of the crystalline growth seed layer of semiconductor material.

8. The process as claimed in claim 7, wherein the bonding layer is an oxide, diamond, AlN or a silicon nitride layer.

9. The process as claimed in claim 1, which further comprises planarizing the surface of each face to be bonded so as to obtain an surface roughness of less than 5 Å RMS.

10. A process for producing a layer of semiconductor material which comprises preparing a composite structure that includes a crystalline growth seed layer in accordance with the process as claimed in claim 1; and epitaxial growing a layer of semiconductor material on the composite structure.

11. The process as claimed in claim 10, which further comprises forming a nucleation layer on the crystalline growth seed layer before epitaxially growing the layer of semiconductor material.

12. The process as claimed in claim 10, wherein the epitaxial growth is carried out for a specified time so as to obtain a combined thickness of the layer of semiconductor material and of the crystalline growth seed layer of at least 100 μm.

13. The process as claimed in claim 12, which further comprises a step of removing the support substrate and the crystalline growth seed layer.

14. The process as claimed in claim 10, wherein the layer of semiconductor material is a GaN layer or a binary, ternary or quaternary Group III/N material.

15. The method of claim 1 which further comprises lapping the layer of semiconductor material after removing the support substrate and crystalline growth seed layer so as to obtain a bow of less than 50 microns.

16. A process for producing a layer of semiconductor material which comprises preparing a composite structure that includes a crystalline growth seed layer in accordance with a process for fabricating a composite structure for epitaxy, which comprises at least one crystalline growth seed layer of a semiconductor material on a support substrate, with the support substrate and crystalline growth seed layer(s) both having, on a periphery of their bonding face, a chamfer or an edge rounding zone, at least one step of bonding by molecular adhesion the crystalline growth seed layer onto the support substrate; and at least one step of thinning the crystalline growth seed layer, such that the crystalline growth seed layer has, after thinning, a diameter identical to its initial diameter; and epitaxial growing a layer of semiconductor material on the composite structure, wherein the epitaxial growth is carried out for a specified time so as to obtain a combined thickness of the layer of semiconductor material and of the crystalline growth seed layer of at least 100 μm, and wherein the process further comprises:
- a step of removing the support substrate and the crystalline growth seed layer,
- a double-sided lapping step carried out on the layer of semiconductor material after removing the support substrate and crystalline growth seed layer so as to obtain a bow of less than 50 microns,
- a step of polishing the face exposed after the removal, and
- a step of removing a peripheral portion of the layer of semiconductor material.

* * * * *

UNITED STATES PATENT AND TRADEMARK OFFICE
CERTIFICATE OF CORRECTION

| | | |
|---|---|---|
| PATENT NO. | : 7,902,045 B2 | Page 1 of 1 |
| APPLICATION NO. | : 12/134019 | |
| DATED | : March 8, 2011 | |
| INVENTOR(S) | : Arena et al. | |

It is certified that error appears in the above-identified patent and that said Letters Patent is hereby corrected as shown below:

IN THE CLAIMS:

Column 11:

Line 2 (claim 5), change "AN" to -- AIN --

Signed and Sealed this
Fifth Day of April, 2011

David J. Kappos
*Director of the United States Patent and Trademark Office*